(12) United States Patent
Lee et al.

(10) Patent No.: US 7,982,650 B2
(45) Date of Patent: Jul. 19, 2011

(54) DIGITAL-TO-ANALOG CONVERTER (DAC) AND AN ASSOCIATED METHOD

(75) Inventors: Tai-Cheng Lee, Taipei (TW); Cheng-Hsiao Lin, Taipei (TW)

(73) Assignee: National Taiwan University, Taipei (TW)

( * ) Notice: Subject to any disclaimer, the term of this patent is extended or adjusted under 35 U.S.C. 154(b) by 0 days.

(21) Appl. No.: 12/571,519

(22) Filed: Oct. 1, 2009

(65) Prior Publication Data

US 2010/0141498 A1 Jun. 10, 2010

(30) Foreign Application Priority Data

Dec. 10, 2008 (TW) .............................. 97148083 A (51) Int. Cl.
*H03M 1/66* (2006.01)
(52) U.S. Cl. ........................................ 341/144; 341/138
(58) Field of Classification Search .................. 341/144, 341/138, 153, 140, 142
See application file for complete search history.

(56) References Cited

U.S. PATENT DOCUMENTS 6,795,063 B2   9/2004 Endo et al.
7,696,909 B2 * 4/2010 Oberhuber .................... 341/119

* cited by examiner

*Primary Examiner* — Peguy JeanPierre
(74) *Attorney, Agent, or Firm* — Tim Tingkang Xia; Morris, Manning & Martin, LLP (57) ABSTRACT

The digital-to-analog converter in accordance with the present invention comprises an R-2R transistor-only ladder converter and a digital controller. The controller connects to the R-2R transistor-only ladder converter and comprises at least one regulating transistor and at least one shifting transistor. The at least one regulating transistor has an aspect ratio of $k_R(W/L)$. The at least one shifting transistor has an aspect ratio of $k_S(W/L)$. Setting the aspect ratios $k_R(W/L)$ and $k_S(W/L)$ of the shifting and regulating transistors adjusts a linear output current waveform to a non-linear waveform. The method to output a non-linear current comprises acts of determining an optimum non-linear output current, dividing a linear output current into multiple sections, determining slopes of the waveform of the output current, adding a controller corresponding to an R-2R transistor-only ladder converter, setting aspect ratios $k_R(W/L)$ of regulating transistors and setting an aspect ratios $k_S(W/L)$ of shifting transistors.

11 Claims, 8 Drawing Sheets

DIGITAL-TO-ANALOG CONVERTER (DAC) AND AN ASSOCIATED METHOD

FIELD OF THE INVENTION

The present invention relates to a digital-to-analog converter (DAC) and a method to output non-linear current, especially to a digital-to-analog converter (DAC) and a method using an R-2R transistor-only ladder converter to output a non-linear current by altering slope and offset.

BACKGROUND OF THE INVENTION

A conventional active matrix type liquid crystal display (LCD) comprises a driving circuit, which further comprises multiple gate drivers, data drivers. The driving circuit is connected to an input data voltage source, which inputs data signals, and controls the LCD to display desired images according to the input data signals.

The data drivers in the driving circuit comprise shifting registers, leveling shifters, digital-to-analog converters (DACs) and a buffer. The shifting registers receive and store the input data signals. The leveling shifters shift input data signals to the buffer. A DAC converts the input data signals in the buffer to output an analog current. The analog current controls the LCD to illuminate lights of different brightness.

Human eyes are more sensitive to dim lights than bright lights, showing a non-linear sensitivity function to brightness. For instance, a person can easily distinguish a 1.0 candela (cd) light from a 0.9 cd light, but can hardly distinguish a 99 cd light from a 99.1 cd light.

Hence to compensate the non-linear sensitivity of human eyes to brightness, every DAC of the data drivers is further adjusted for the capability to output a non-linear current. Such adjustment is called a gamma correction.

A conventional gamma correction adjusted DAC comprises a reference voltage generator and a gamma correction circuit. The reference voltage generator generates However, the conventional DAC uses a resistor-string ladder in which the resistors The digital input terminal pairs ($D_{in}$) receive digital signals in binary (0/1), drive the ON/OFF states of the second transistors (T2) and the fourth transistors (T4) and comprises a main component terminal (D) and an inverse component terminal (D') or be implemented with an inverter in two diverging paths as switches (for example: D'=1 when D=0, the second transistor (T2) is ON and the fourth transistor (T4) is OFF).

The main component terminals (D) are connected respectively to the corresponding gates of the second transistors (T2).

The inverse component terminals (D') are connected respectively to the corresponding gates of the fourth transistors (T4).

The dump transistor ($M_{dump}$) has an aspect ratio W/L and comprises a gate, a drain and a source. The gate of the dump transistor ($M_{dump}$) is connected to the gate input terminal ($V_G$). The drain of the dump transistor ($M_{dump}$) is connected to the dump output current terminal ($V_{dump}$). The source of the dump transistor ($M_{dump}$) is connected to adjacent drain of the third transistor (T3).

The controller (11) changes the linear analog output current of the R-2R transistor-only ladder converter (10) into an optimum non-linear analog output current and comprises at least one switch (SW), at least one regulating transistor ($T_R$) and at least one shifting transistor ($T_S$).

Each switch (SW) is a NAND logic gate and comprises multiple input ends and an output end. The output end is connected to the corresponding regulating transistor ($T_R$) and the shifting transistor ($T_s$). The input ends are connected respectively to the corresponding digital input terminal pairs ($D_{in}$).

The regulating transistors ($T_R$) change output current slope and are connected between corresponding cells (C). Each regulating transistor ($T_R$) has an aspect ratio $K_R$ (W/L) and comprises a drain, a source and a gate. The slope can be changed by increasing the output current slope or decreasing the output current slope.

Figure 2:
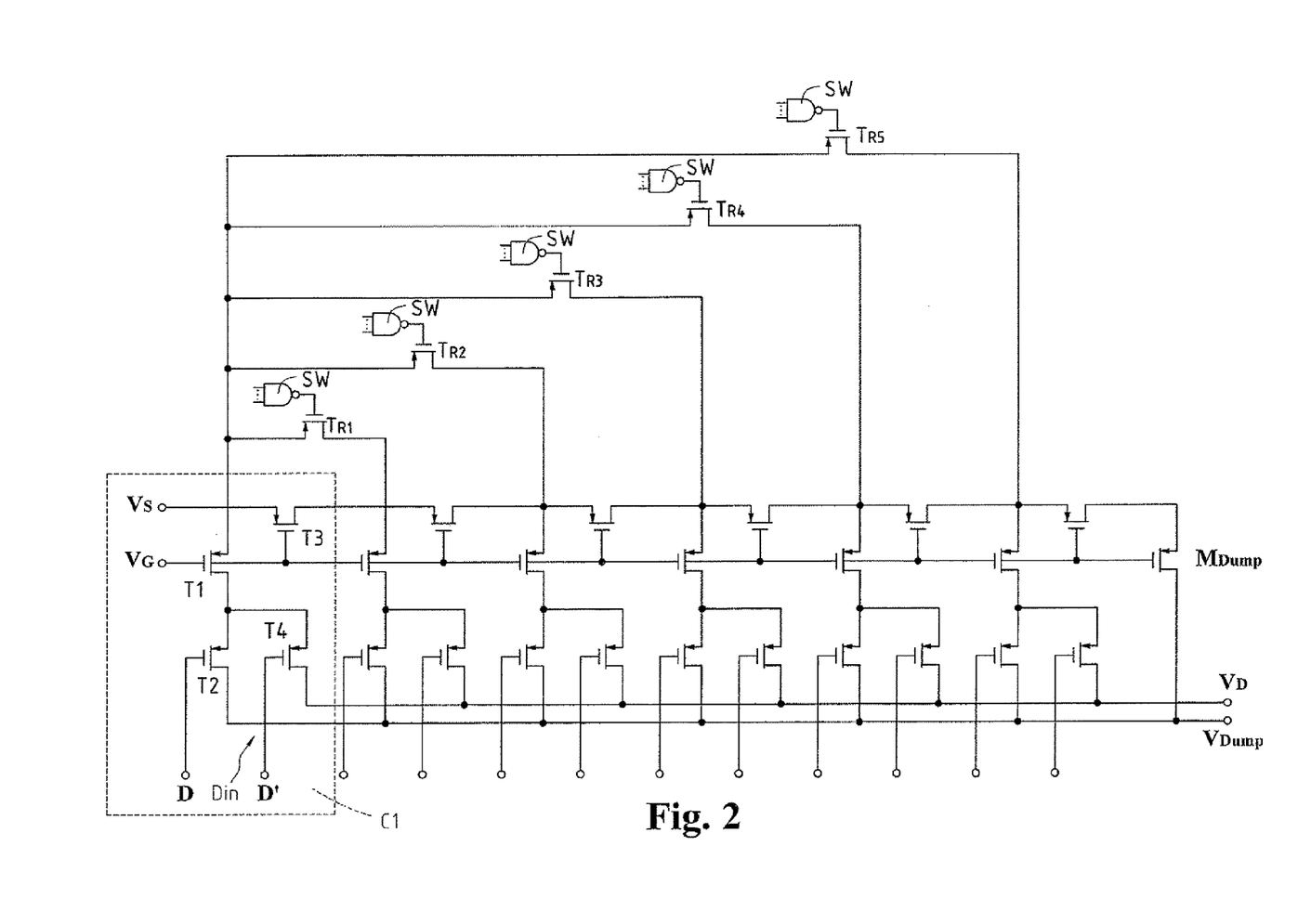
FIG. 2 is a circuit diagram of regulating transistors in a 6-bit digital-to-analog converter in accordance with the present invention that adjusts output current by increasing the current slope.

With further reference to FIG. 2 illustrating an embodiment of increasing current slopes, the sources of the regulating transistors ($T_{R1} \sim T_{R5}$) are connected to the source input terminal ($V_s$). The drains of the regulating transistors ($T_{R1} \sim T_{R5}$) are connected respectively to the corresponding sources of the third transistors (T3) and sources of the first transistors (T1) of adjacent cell (C). The gates of the regulating transistors ($T_{R1} \sim T_{R5}$) must be precisely matched, and the layout of the resistor-string ladder must be aligned perfectly. Otherwise the output may have too much distortion.

U.S. Pat. No. 6,795,063 discloses another conventional DAC for gamma correction using a Look-Up-Table (LUT) method.

The LUT determines the colors and intensity values with which a particular image will be displayed with given digital figures to output non-linear signals from the data driver to the TFT array substrate.

However, employing a LUT in the DAC requires cache (such as read-only memory (ROM)) to reduce a digital figure's storage time and memory retrieval time, and the complexity of memory may be a problem when polling the cache. The large quantity of data accesses for a large table will cause cache misses that increasingly become an issue as processors outpace memory.

SUMMARY OF THE INVENTION

The objective of the present invention is to provide a digital-to-analog converter (DAC) by adding a digital selected controller to an R-2R transistor-only ladder converter that changes output current of the R-2R transistor-only ladder converter to a non-linear output and can be used in the driving circuit of display applications.

The second objective is to provide a method to output a non-linear current by changing slope and offset of waveform based on aspect ratios $k_R$ (W/L) of regulating transistors and aspect ratios $k_S$ (W/L) of shifting transistors.

The DAC in accordance with the present invention comprises an R-2R transistor-only ladder converter and a digital controller. The controller connects to the R-2R transistor-only ladder converter and comprises at least one regulating transistor and at least one shifting transistor. The at least one regulating transistor has an aspect ratio of $k_R$ (W/L). The at least one shifting transistor has an aspect ratio of $k_S$ (W/L). Setting the aspect ratios $k_R$ (W/L) and $k_S$ (W/L) of the regulating and shifting transistors respectively adjusts a linear output current waveform to a non-linear waveform. The method to output a non-linear current comprises acts of determining an optimum non-linear output current, dividing a linear output current into multiple sections, determining the slopes and the offsets of the waveform of the output current, adding a controller corresponding to an R-2R transistor-only ladder converter, setting aspect ratios of regulating transistors and setting aspect ratios of shifting transistors.

DETAILED DESCRIPTION OF THE PRESENT INVENTION

Figure 1:
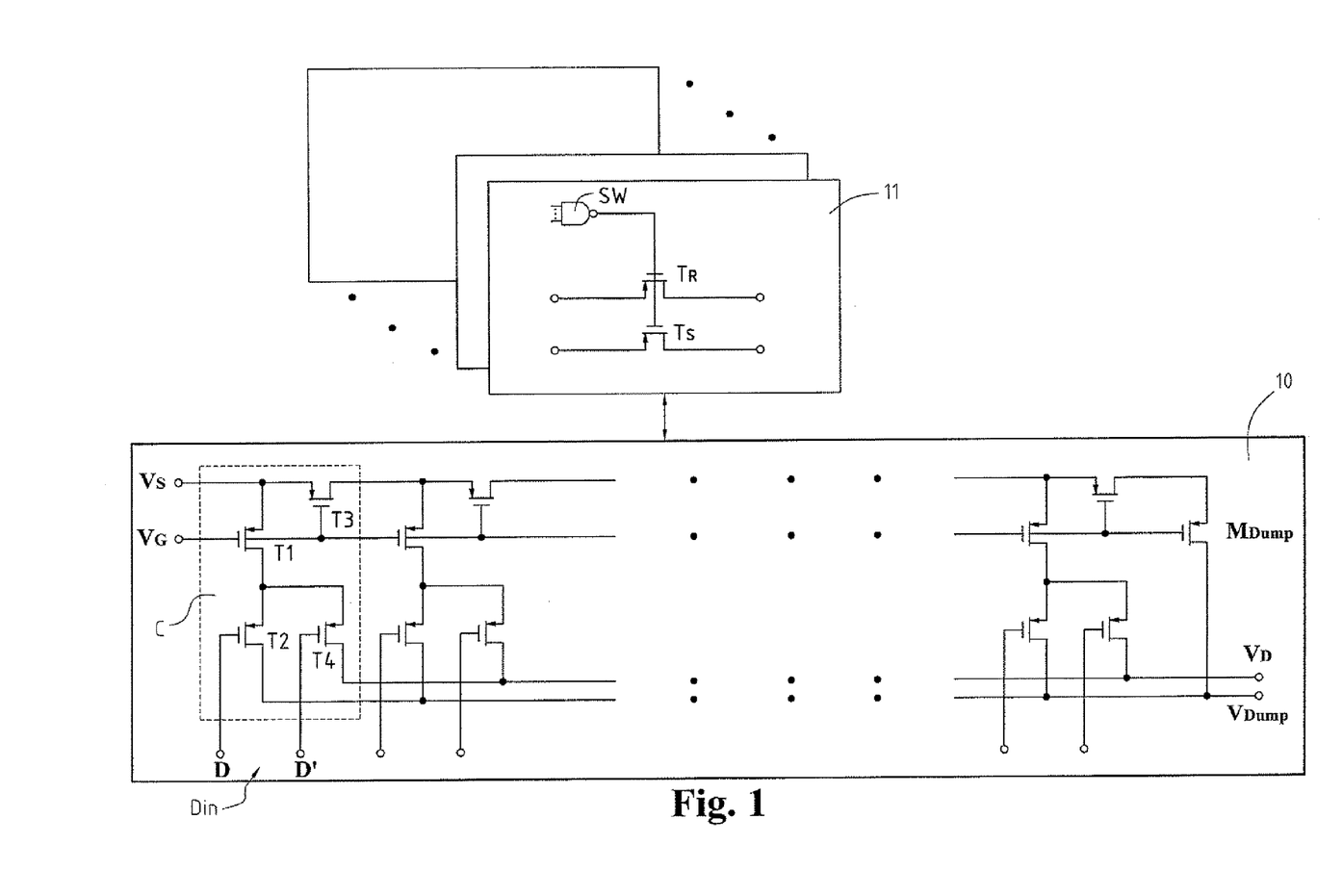
FIG. 1 is circuit diagram of a digital-to-analog converter in accordance with the present invention.

With reference to FIG. 1, a digital-to-analog converter (DAC) in accordance with the present invention comprises an R-2R transistor-only ladder converter (10) and a controller (11).

The R-2R transistor-only ladder converter (10) converts digital signals to a linear analog output current and comprises a source input terminal ($V_s$), a gate input terminal ($V_G$), a drain output current terminal ($V_D$), a dump output current terminal ($V_{dump}$), multiple cells (C), multiple digital input terminal pairs ($D_{in}$) and a dump transistor ($M_{dump}$).

The cells (C) operate in the linear region and are connected to each other. Each cell (C) converts one-word (one-bit) for digital-to-analog conversion, is connected to adjacent cells (C) and comprises a first transistor (T1), a second transistor (T2), a third transistor (T3) and a fourth transistor (T4).

Each first transistor (T1) has an aspect ratio W/L and comprises a gate, a drain and a source. The gates of the first transistors (T1) are connected to the gate input terminal ($V_G$). The drains of first transistors (T1) are connected respectively to the corresponding sources of the second transistors (T2) and the fourth transistors (T4). One source of the first transistor (T1) is connected to the source input terminal ($V_s$) and the other sources of the first transistors (T1) are connected to the corresponding source of the third transistors (T3).

Each second transistor (T2) has an aspect ratio W/L and comprises a gate, a drain and a source. The gates of the second transistors (T2) are connected respectively to the corresponding digital input terminal pairs ($D_{in}$). The drains of the second transistors (T2) are connected to the dump output current terminal ($V_{dump}$). The sources of the second transistors (T2) are connected respectively to the corresponding drains of the first transistors (T1) and the sources of the fourth transistors (T4).

Each third transistor (T3) has an aspect ratio W/L and comprises a gate, a drain and a source. The gates of the third transistors (T3) are connected to the gate input terminal ($V_G$). The drains of the third transistors (T3) are connected to the sources of the corresponding first and third transistors (T1, T3) of adjacent cell (C). One source of the third transistor (T3) is connected to the source input terminal ($V_s$) and the other sources of the third transistors (T3) are connected to the corresponding source of the first transistors (T1) of adjacent cell (C).

Each fourth transistor (T4) has an aspect ratio W/L and comprises a gate, a drain and a source. The gates of the fourth transistors (T4) are connected to the corresponding digital input terminal pairs ($D_{in}$). The drains of the fourth transistors (T4) are connected to the drain output current terminal ($V_D$). The sources of the fourth transistors (T4) are connected to the drains of the first transistor (T1) and the sources of the second transistors (T2). are connected respectively to the output ends of the corresponding switches (SW).

Figure 3A:
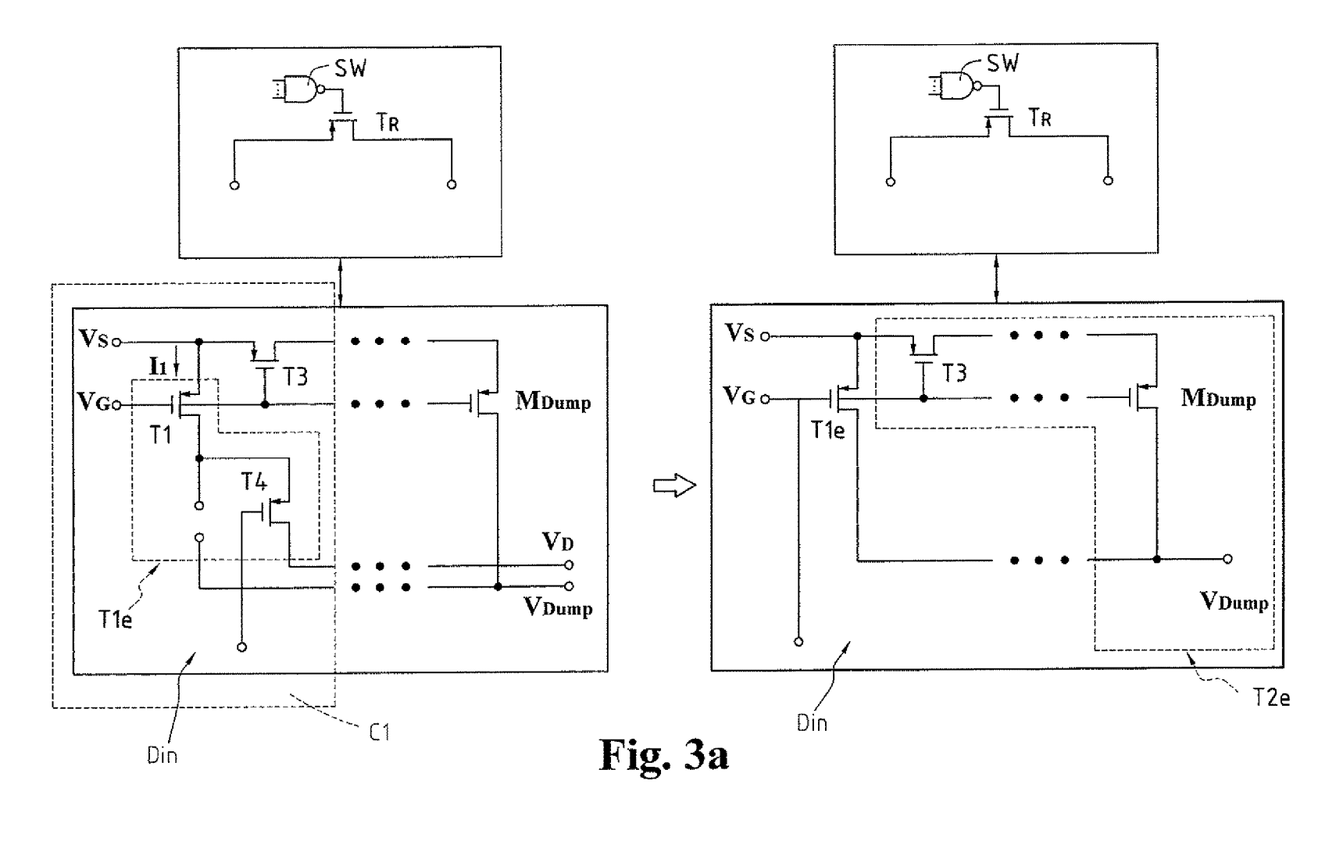
FIG. 3a is a circuit diagram when second transistors in FIG. 2 are turned OFF.
Figure 3B:
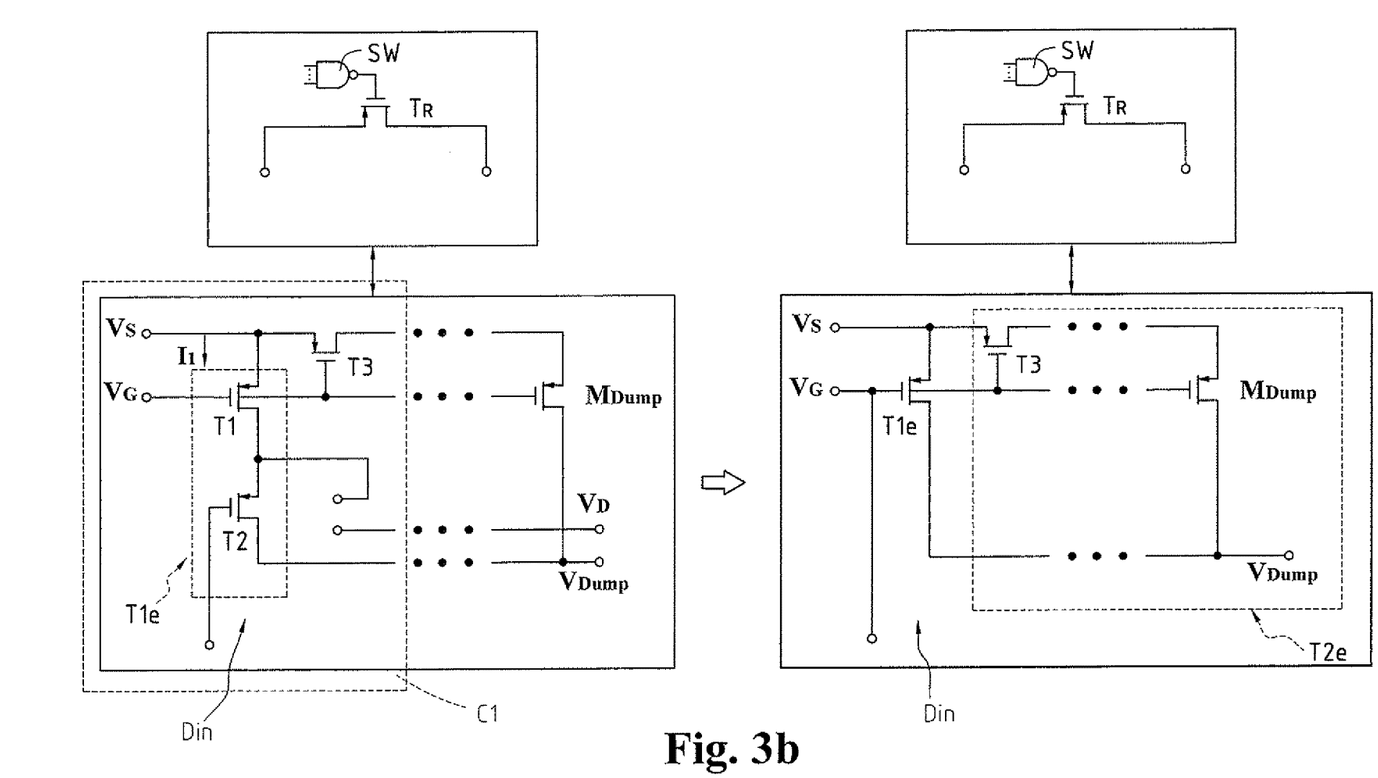
FIG. 3b is a circuit diagram when fourth transistors in FIG. 2 are turned OFF.

With further reference to FIGS. 3a and 3b, the second transistor (T2) or the fourth transistor (T4) in the cell can be turned ON (controlled by the digital input of the digital input terminal pair ($D_{in}$)) since only one transistor in each cell is turned on.

In a first cell (C1), the first transistor (T1) being connected in series to the second transistor (T2) is equivalent to a first equivalent transistor ($T1_e$) with aspect ratio W/2 L, and the third transistor (T3) being connected in series to the adjacent cell (C) and the dump transistor (Mdump) is equivalent to a second equivalent transistor ($T_{2e}$) with aspect ratio W/2 L when the fourth transistor (T4) is turned OFF. Both equivalent transistors ($T1_e$, $T2_e$) connected in parallel that is equivalent to an overall transistor with aspect ratio W/L.

A current $I_1$ flows through the first equivalent transistor ($T1_e$) in a MSB current path can be obtained $$I_1 = \mu_p C_{ox}\left(\frac{W}{2L}\right)\left[(V_{SG} - V_{TH})V_{SD} - \frac{1}{2}V_{SD}^2\right],$$

and

The sum of the currents that flow through the second equivalent transistor ($T2_e$) and the regulating transistor ($T_{R1}$) is expressed as current $I_2$ $$I_2 = \mu_p C_{ox}\left(\frac{(K_{R1}+1)W}{(K_{R1}+2)L}\right)\left[(V_{SG} - V_{TH})V_{SD} - \frac{1}{2}V_{SD}^2\right],$$

wherein $K_{R1}$ identifies an aspect ratio of the regulating transistor ($T_{R1}$).

Since the current of the R-2R transistor-only ladder converter converts digital input ($D_{in}$) to the analog output. Therefore, a comparison of current $I_1$ and $I_2$ are presented in LSB unit for slope changes.

However, the regulating transistor ($T_{R1}$) is connected in parallel with the third transistor (T3) with an equivalent aspect ratio ($k_{R1}+1$)(W/L) being controlled by the switches (SW) in a codes' segment range. Therefore, the voltage of the drain of the regulating transistor ($T_{R1}$) increase according to the value of $k_{R1}$, and the currents flow through corresponding cells (C) will increase, too.

Figure 4:
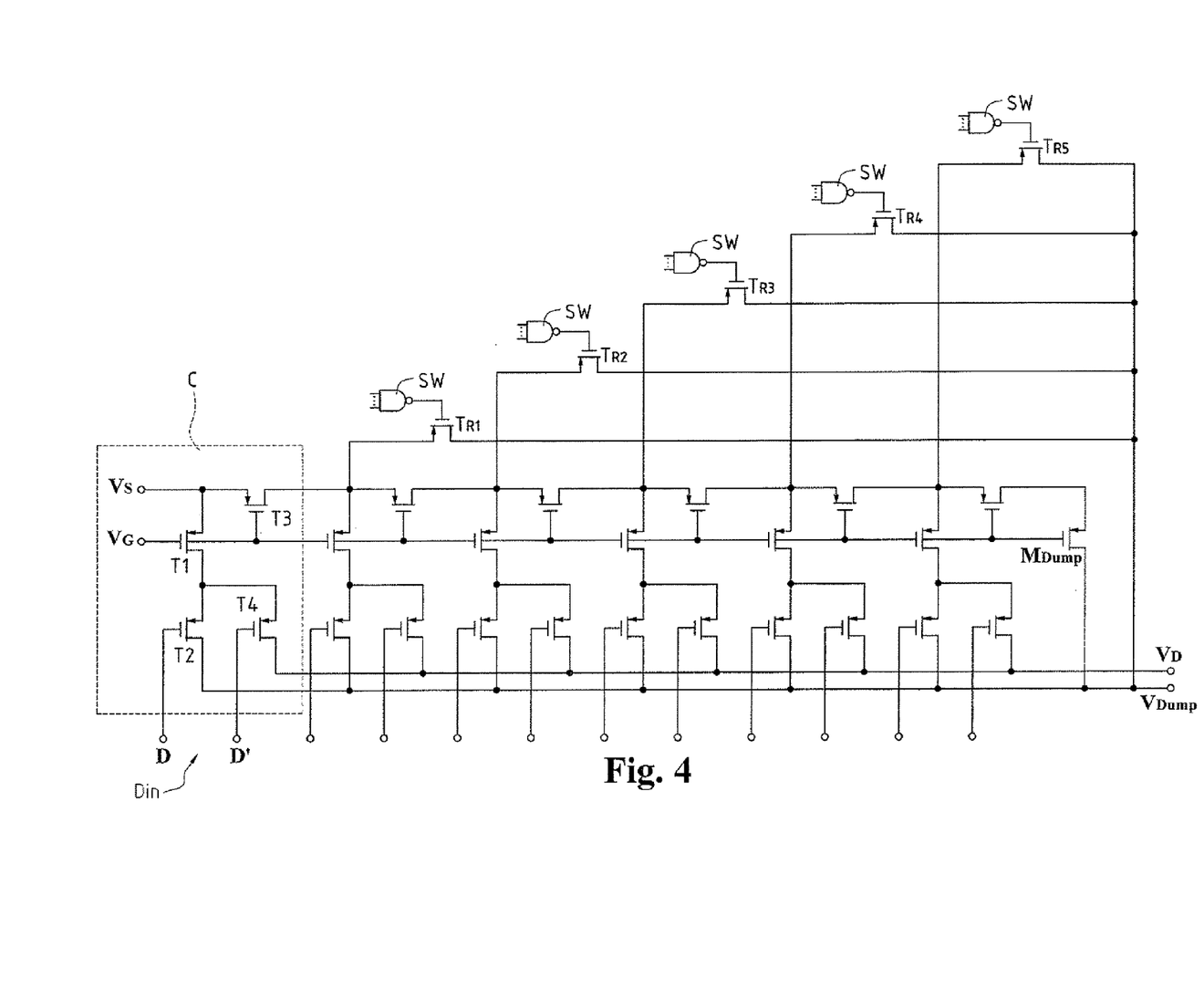
FIG. 4 is a circuit diagram of regulating transistors in a 6-bit digital-to-analog converter in accordance with the present invention that adjusts output current by decreasing the current slope.

With reference to FIG. 4 illustrating an embodiment of decreasing current slope, the sources of the regulating transistors ($T_{R1}$~$T_{R5}$) are connected to join two corresponding cells (C). The drains of the regulating transistors ($T_{R1}$~$T_{R5}$) are connected to the dump output current terminal ($V_{Dump}$).

The gates of the regulating transistors ($T_{R1} \sim T_{R5}$) are connected to the corresponding output ends of the switches (SW).

Therefore, the voltage of the sources of the regulating transistors ($T_{R1} \sim T_{R5}$) will decrease based on the value of each $k_R$, and the currents flow through the cells (C) to the drain output current terminal ($V_D$) will decrease within the controlled range of codes' segment.

Figure 5:
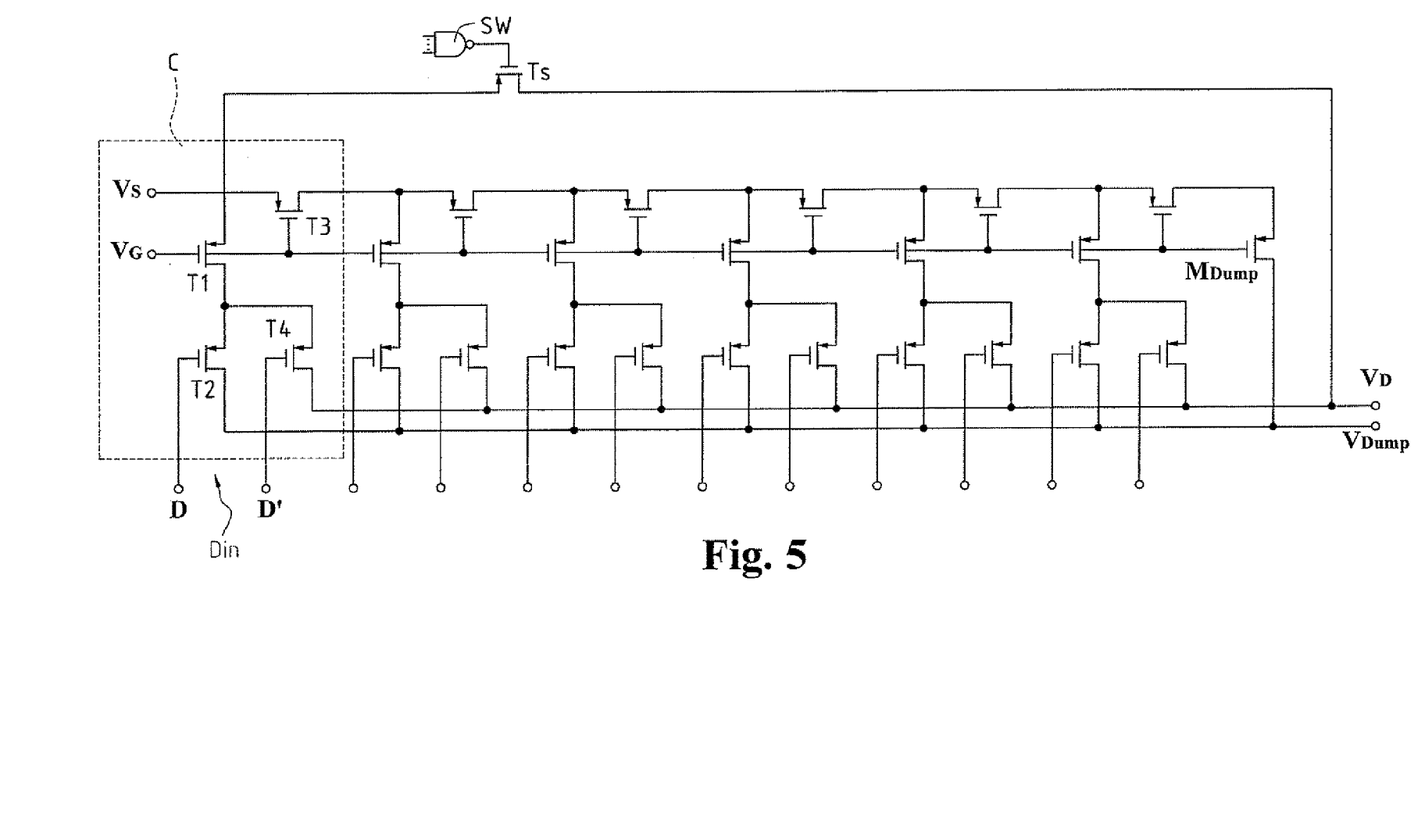
FIG. 5 is a circuit diagram of a shifting transistor in a 6-bit digital-to-analog converter, which increase the current amplitude in accordance with the present invention by adding an extra current path (from a source input terminal ($V_s$) to a drain output current terminal ($V_D$))

With further reference to FIG. 5, the shifting transistor ($T_S$) having an aspect ratio $k_S(W/L)$ increases the current amplitude by giving a extra current path (from the source input terminal ($V_s$) to the drain output current terminal ($V_D$)) and comprises a source, a drain and a gate, and the current of the drain output current terminal ($V_D$) will increase based on the value of $k_S(W/L)$.

The sources of the shifting transistors ($T_S$) are connected to the source input terminal ($V_s$). The drains of the shifting transistors ($T_S$) are connected to the drain output current terminal ($V_D$). The gates of the shifting transistors ($T_S$) are connected respectively to the corresponding output end of the switch (SW).

Moreover, the number of digital signal input terminals ($D_{in}$) and cells (C) are determined by the bits in the color/grayscale of a display requirement (i.e. a 6-bit display has 6 cells). Therefore, the digital-to-analog converter of the present invention can apply to all kinds of display by designing controllers to the R-2R transistor-only ladder converter circuit without having a unique design for a particular display.

Therefore, gamma correction does not need to use a Look-Up-Table (LUT) that slows down the display or resistor-string ladders that increase bit with large area to implement grayscale in the display.

EXAMPLE

Figure 6:
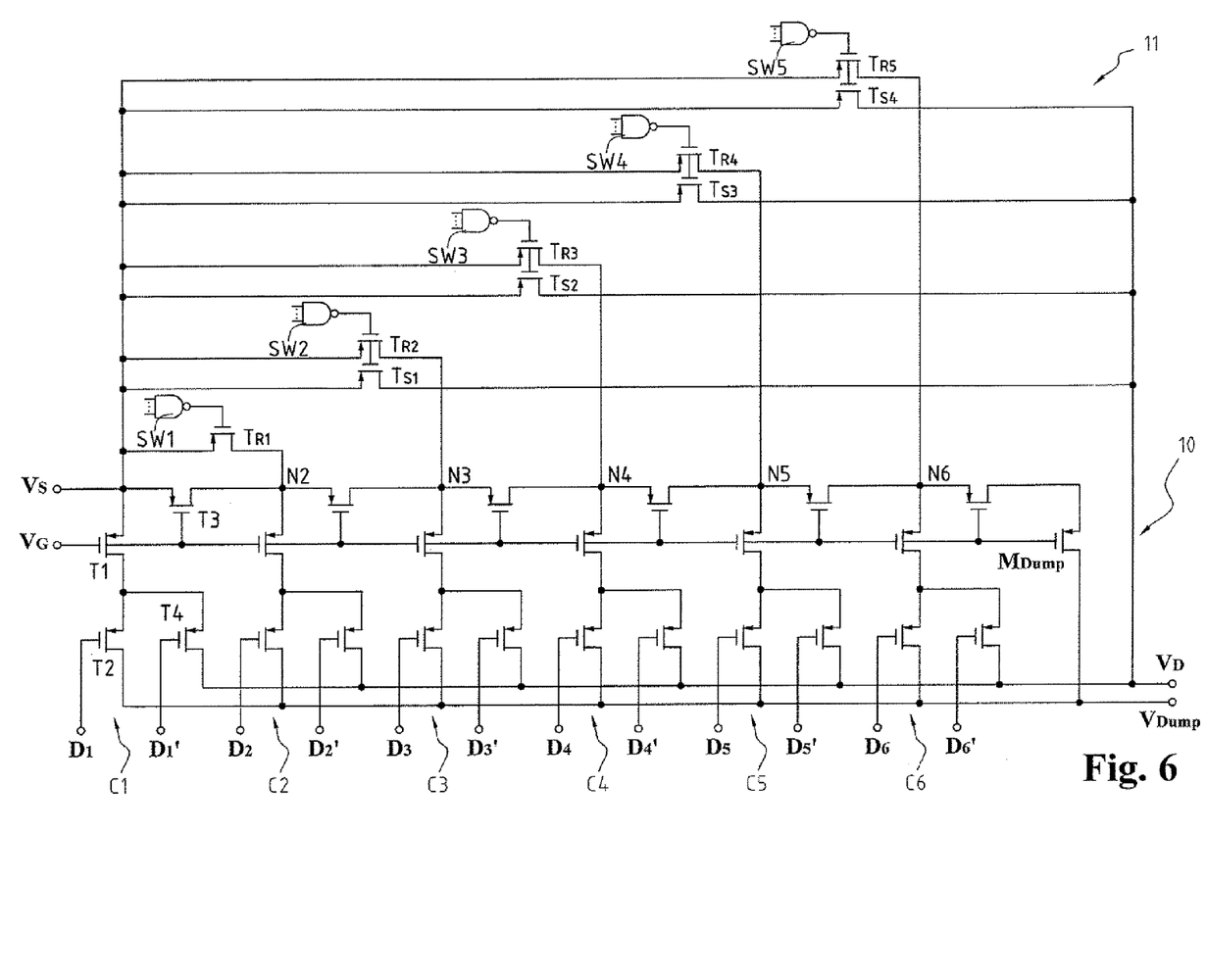
FIG. 6 is a circuit diagram of a 6-bit digital-to-analog converter in accordance with the present invention.

With reference to FIG. 6, a 6-bit digital-to-analog converter used in driving circuits of displays increases the slope of the output current for gamma correction based on an optimum gamma curve comprises an R-2R transistor-only ladder converter (10) and a controller (11).

The R-2R transistor-only ladder converter (10) receives digital signals and outputs a linear analog output current and comprises a source input terminal ($V_s$), a gate input terminal ($V_G$), a drain output current terminal ($V_D$), a dump output current terminal ($V_{Dump}$), six digital input terminal pairs (($D_1$, $D_1'$), ($D_2$, $D_2'$), ($D_3$, $D_3'$), ($D_4$, $D_4'$), ($D_5$, $D_5'$), ($D_6$, $D_6'$)), six cells (C1~C6) and a dump transistor ($M_{Dump}$). The six cells (C1~C6) are connected in sequences of parallel and series and comprise 6 nodes (N1~N6).

The digital input terminal pairs (($D_1$, $D_1'$), ($D_2$, $D_2'$), ($D_3$, $D_3'$), ($D_4$, $D_4'$), ($D_5$, $D_5'$), ($D_6$, $D_6'$)) receive digital signals in binary (0/1) and drives the ON/OFF states of the second transistor and the fourth transistor of each cell (C1~C6). Each digital input terminal pair (($D_1$, $D_1'$), ($D_2$, $D_2'$), ($D_3$, $D_3'$), ($D_4$, $D_4'$), ($D_5$, $D_5'$), ($D_6$, $D_6'$)) comprises a main component terminal (($D_1$), ($D_2$), ($D_3$), ($D_4$), ($D_5$), ($D_6$)) and an inverse component terminal (($D_1'$), ($D_2'$), ($D_3'$), ($D_4'$), ($D_5'$), ($D_6'$)).

The current from the source input terminal ($V_s$) through the R-2R transistor-only ladder converter (10) is defined with ($D_1$, $D_1'$) being a most significant bit (MSB) and ($D_6$, $D_6'$) being a least significant bit (LSB).

The main component terminals ($D_1 \sim D_6$) are connected respectively to the corresponding gates of the second transistors of cell (C1~C6).

The inverse component terminals ($D_1' \sim D_6'$) are connected respectively to the corresponding gates of the fourth transistors of cell (C1~C6).

The dump transistor ($M_{Dump}$) comprises a gate, a drain and a source. The gate of the dump transistor ($M_{Dump}$) is connected to the gate input terminal ($V_G$). The drain of the dump transistor ($M_{Dump}$) is connected to the dump output current terminal ($V_{Dump}$). The source of the dump transistor ($M_{Dump}$) is connected to drain of the third transistor of the adjacent cell (C6).

The controller (11) changes output current of the R-2R transistor-only ladder converter (10) to an optimum non-linear analog output current based on the non-linear output current of the optimum gamma curve and comprises five switches (SW1~SW5), five regulating transistors ($T_{R1} \sim T_{R5}$) and four shifting transistors ($T_{S1} \sim T_{S4}$).

The switch is a NAND logic gate having at least one input end and an output end. The output ends are connected to the corresponding regulating transistor ($T_{R1} \sim T_{R5}$) and the shifting transistor ($T_{S1} \sim T_{S4}$). The input ends are connected respectively to corresponding digital input terminal pairs (($D_1$, $D_1'$), ($D_2$, $D_2'$), ($D_3$, $D_3'$), ($D_4$, $D_4'$), ($D_5$, $D_5'$), ($D_6$, $D_6'$)) that deal with different codes' segment.

The output end of the switch (SW1) is connected to the gate of the regulating transistor ($T_{R1}$). The input ends are connected to the inverse component terminal ($D_1'$) and control range of 0~31 codes' segment of the R-2R transistor-only ladder converter (10).

The output end of the switch (SW2) is connected to the gate of regulating transistor ($T_{R2}$). The input ends are connected respectively to the corresponding component terminal pairs ($D_1$ and $D_2'$) and control range of 32~47 codes' segment of the R-2R transistor-only ladder converter (10).

The output end of the switch (SW3) is connected to the gate of the regulating transistor ($T_{R3}$). The input ends are connected respectively to the corresponding component terminals ($D_1$, $D_2$, $D_3'$) and control range of 48~55 codes' segment of the R-2R transistor-only ladder converter (10).

The output end of the switch (SW4) is connected to the gate of the regulating transistor ($T_{R4}$). The input ends are connected respectively to the corresponding component terminal pairs ($D_1$, $D_2$, $D_3$, $D_4'$) and control range of 56~59 codes' segment of the R-2R transistor-only ladder converter (10).

The output end of the switch (SW5) is connected to the gate of the regulating transistor ($T_{R5}$). The input ends are connected respectively to the corresponding component terminal pairs ($D_1$, $D_2$, $D_3$, $D_4$, $D_5'$) and control range of 60~61 codes' segment of the R-2R transistor-only ladder converter (10).

The regulating transistors ($T_{R1} \sim T_{R5}$) change slope of current, have aspect ratios of $k_{R1}(W/L)$, $k_{R2}(W/L)$, $k_{R3}(W/L)$, $k_{R4}(W/L)$ and $k_{R5}(W/L)$ respectively and comprise a drain, a source and a gate.

The drain of the regulating transistor ($T_{R1}$) is connected to N2. The source of the regulating transistor ($T_{R1}$) is connected to the source input terminal ($V_s$). The gate of the regulating transistor ($T_{R1}$) is connected to the output end of the switch (SW1). The maximum slope change in the range of 0~31 codes' segment of the R-2R transistor-only ladder converter (10) is 2.

The drain of the regulating transistor ($T_{R2}$) is connected to N3. The source of the regulating transistor ($T_{R2}$) is connected to the source input terminal ($V_s$). The gate of the regulating transistor ($T_{R2}$) is connected to the output end of the switch (SW2). The maximum slope change in the range of 32~47 codes' segment of the R-2R transistor-only ladder converter (10) is 4.

The drain of the regulating transistor ($T_{R3}$) is connected to N4. The source of the regulating transistor ($T_{R3}$) is connected to the source input terminal ($V_s$). The gate of the regulating transistor ($T_{R3}$) is connected to the output end of the switch (SW3). The maximum slope change in the range of 48~55 codes' segment of the R-2R transistor-only ladder converter (10) is 8.

The drain of the regulating transistor ($T_{R4}$) is connected to N5. The source of the regulating transistor ($T_{R4}$) is connected to the source input terminal ($V_s$). The gate of the regulating transistor ($T_{R4}$) is connected to the output end of the switch (SW4). The maximum slope change in the range of 56~59 codes' segment of the R-2R transistor-only ladder converter (10) is 16.

The drain of the regulating transistor ($T_{R5}$) is connected to N6. The source of the regulating transistor ($T_{R5}$) is connected to the source input terminal ($V_s$). The gate of the regulating transistor ($T_{R5}$) is connected to the output end of the switch (SW5). The maximum slope change in the range of 60~61 codes' segment of the R-2R transistor-only ladder converter (10) is 32.

Accordingly, the relationship of the slope change between the optimum gamma curve and the linear analog output current for this particular example are dependent on the aspect ratios $k_{R1}$(W/L), $k_{R2}$(W/L), $k_{R3}$(W/L), $k_{R4}$(W/L) and $k_{R5}$(W/L) of the regulating transistors ($T_{R1}$~$T_{R5}$) shown in table 1.

TABLE 1

(Unit: LSB).

| controllable codes range (codes' segment) | 32 codes (0~31) | 16 codes (32~47) | 8 codes (48~55) | 4 codes (56~59) | 2 codes (60~61) |
|---|---|---|---|---|---|
| the relationship of the slope changes and value of $k_R$ | $2\dfrac{k_{R1}+1}{k_{R1}+2}$ | $4\dfrac{(5k_{R2}+2)}{(5k_{R2}+8)}$ | $8\dfrac{(21k_{R3}+4)}{(21k_{R3}+32)}$ | $16\dfrac{(85k_{R4}+8)}{(85k_{R4}+128)}$ | $32\dfrac{(341k_{R5}+16)}{(341k_{R5}+512)}$ |

If the comparison slope changes between the optimum gamma curve on corresponding figure and the linear analog output current on corresponding figure are 1.5, 2, 4, 8 and 16, $k_{R1}$~$k_{R5}$ in each segment can be derived as follows:

$$2\frac{(k_{R1}+1)}{(k_{R1}+2)} = 1.5, \text{ and } k_{R1} = 2;$$

$$4\frac{(5k_{R2}+2)}{(5k_{R2}+8)} = 2, \text{ and } k_{R2} = 0.8;$$

$$8\frac{(21k_{R3}+4)}{(21k_{R3}+32)} = 4, \text{ and } k_{R3} = 1.15;$$

$$16\frac{(85k_{R4}+8)}{(85k_{R4}+128)} = 8, \text{ and } k_{R4} = 1.32; \text{ and}$$

$$32\frac{(341k_{R5}+16)}{(341k_{R5}+512)} = 16, \text{ and } k_{R5} = 1.41.$$

The shifting transistors ($T_{S1}$~$T_{S4}$) have aspect ratios $k_{S1}$(W/L), $k_{S2}$(W/L), $k_{S3}$(W/L) and $k_{S4}$(W/L) respectively, increase the current amplitude by giving an extra current path to the drain output current terminal ($V_D$) and comprise a drain, a source and a gate.

The sources of the shifting transistors ($T_{S1}$~$T_{S4}$) are connected to the source input terminal ($V_s$). The drains of the shifting transistors ($T_{S1}$~$T_{S4}$) are connected to the drain output current terminal ($V_D$). The gates of the shifting transistors ($T_{S1}$~$T_{S4}$) are connected respectively to the switches (SW2~SW5) and the gates of the regulating transistors ($T_{R2}$~$T_{R5}$).

Figure 7:
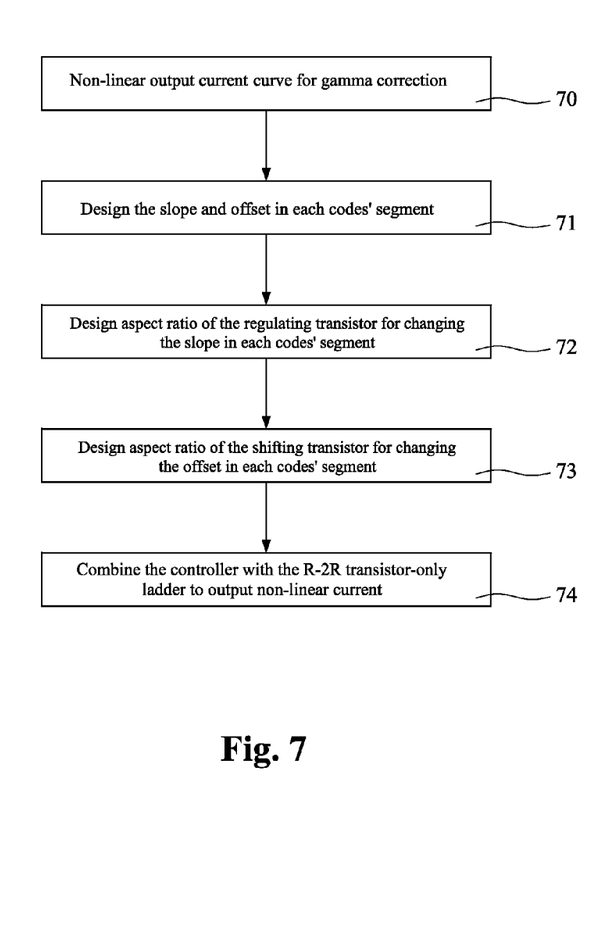
FIG. 7 is a flow diagram of a method to output a non-linear current in accordance with the present invention.

With reference to FIG. 7, A method to output a non-linear current comprises acts of determining an optimum non-linear output current curve for gamma correction (70), dividing the non-linear curve into multiple segments and designing the slope and offset in each segment to fit the optimum non-linear output (71), determining the aspect ratio of regulating transistor for changing the slope in each codes' segment (72), determining the aspect ratio of shifting transistor for changing the offset in each codes' segment (73), combining the controller with the R-2R transistor-only ladder to output non-linear current (74).

The act of determining an optimum non-linear output current (70) determines the optimum non-linear output current based on a gamma curve of a specific Liquid Crystal Display (LCD) and obtaining a linear output current produced by the R-2R transistors-only ladder converter (10);

The act of dividing the non-linear curve into multiple segments and design the values of slope and offset in each codes' segment (71).

The act of determining the aspect ratio of regulating transistor for changing the slope in each codes' segment (72).

The act of determining the aspect ratio of shifting transistor for changing the offset in each codes' segment (73).

The act of combining a controller corresponding to the R-2R transistors-only ladder converter to output current waveform to agree with the optimum non-linear output current (74), and the controller comprises at least one regulating transistor and at least one shifting transistor.

The slopes of the waveform of the optimum non-linear output current and the linear output current in each section can be defined as increasing or decreasing the current slopes respectively by the following general form:

$$2^L \frac{\left(\sum_{i=1}^{L} 2^{2(i-1)} K\right) + 2^{L-1}}{\left(\sum_{i=1}^{L} 2^{2(i-1)} K\right) + 2^{2L-1}}$$

$$2^L \frac{2^{L-1}}{\left(\sum_{i=1}^{L} 2^{2(i-1)} K\right) + 2^{2L-1}},$$

wherein L={1, 2, . . . , j} (i.e. a set of natural numbers) and value of j is corresponding to the cell number next to the MSB cell (C1).

Since the slope of the output current is a known value, the value of the aspect ratio $k_R$ can be easily calculated. Therefore, adjusting the aspect ratios $k_R$ of the regulating transistors to change the slope of the output current is easy. Moreover, the same concept can be applied to set the aspect ratios $k_S$ of the shifting transistors to offset the position of the output current waveform by knowing the displacement.

People skilled in the art will understand that various changes, modifications, and alterations in form and details may be made without departing from the spirit and scope of the invention.

What is claimed is:

1. A digital-to-analog converter (DAC) comprising:
an R-2R transistor-only ladder converter converting digital signals into a linear analog output current and comprising:
a source input terminal;
a gate input terminal;
a drain output current terminal;
a dump output current terminal;
multiple cells operating in a linear region, being connected in sequences of parallel and series, each cell converting one bit for digital-to-analog conversion, being connected to the adjacent cells;
digital input terminal pairs receiving digital signals in binary (0/1) and driving the ON/OFF corresponding to the cells; and
a dump transistor comprising:
a gate, the gate of the dump transistor being connected to the gate input terminal;
a drain, the drain of the dump transistor being connected to the dump output current terminal; and
a source, the source of the dump transistor being connected to an adjacent cell; and
a controller being connected to the R-2R transistor-only ladder converter and changing the linear analog output current of the R-2R transistor-only ladder converter into an optimum non-linear analog output current.

2. The DAC as claimed in claim 1, wherein each cell comprises:
a first transistor comprising:
a gate, the gate of the first transistor being connected to the gate input terminal;
a drain; and
a source; and
a second transistor comprising:
a gate, the gate of the second transistor being connected to one of the digital input terminal pairs;
a drain, the drains of the second transistor being connected to the dump output current terminal; and
a source, the source of the second transistor being connected to the drain of the first transistor;
a third transistor comprising:
a gate, the gate of the third transistor being connected to the gate input terminal and the gate of the first transistor;
a drain, the drain of the third transistor being connected to the source of the third transistor of the immediately next adjacent cell; and
a source, the source of the third transistor being connected to the drain of the third transistor of the immediately prior adjacent cell and the source of the first transistor; and
a fourth transistor comprising
a gate, the gate of the second transistor being connected to the other of the digital input terminal pairs;
a drain, the drain of the fourth transistor being connected to the drain output current terminal; and
a source, the source of the fourth transistor being connected to the drain of the first transistor and the source of the second transistor
wherein the source of the third transistor of the first cell is connected to the source input terminal, and wherein the drain of the third transistor of the last cell is connected to the source of the dump transistor.

3. The DAC as claimed in claim 2, wherein the digital input terminal pairs drive the ON/OFF of the second transistors and the fourth transistors of the multiple cells and comprising:
a main component terminal being connected respectively to the corresponding gates of the second transistors; and
an inverse component terminal being connected respectively to the corresponding gates of the fourth transistors.

4. The DAC as claimed in claim 3, wherein the digital input terminal pairs is implemented with an inverter in two diverging paths as switches.

5. The DAC as claimed in claim 3, wherein the controller comprises:
at least one switch, each switch comprising:
an output end; and
multiple input ends being connected respectively to the corresponding digital input terminal pairs;
at least one regulating transistor having aspect ratios $K_R(W/L)$, being connected between corresponding cells; and
at least one shifting transistor having aspect ratios $K_S(W/L)$, increasing the current amplitude by giving an extra current path by setting an aspect ratio $K_S(W/L)$.

6. The DAC as claimed in claim 5, wherein each regulating transistor comprises:
a source, the sources of the regulating transistors being connected to the source input terminal;
a drain, the drains of the regulating transistors being connected respectively to the corresponding drains of the third transistors and sources of the first transistors of the corresponding cell; and
a gate, the gates of the regulating transistors being connected to the output ends of the corresponding switches.

7. The DAC as claimed in claim 5, wherein each shifting transistor comprises:
a source, the sources of the shifting transistors being connected to the source input terminal;
a drain, the drains of the shifting transistors being connected to the drain output current terminal;
a gates, the gates of the shifting transistors being connected respectively to the corresponding output end of the switch.

8. The DAC as claimed in claim 5, wherein each regulating transistor comprises:
a source, the sources of the regulating transistors being connected to join of two corresponding cells;
a drain, the drains of the regulating transistors being connected to the corresponding drains output current terminal;
a gate, the gates of the regulating transistors being connected to the corresponding output ends of the switches.

9. The DAC as claimed in claim 8, wherein each shifting transistor comprises:
a source, the sources of the shifting transistors being connected to the source input terminal;
a drain, the drains of the shifting transistors being connected to the drain output current terminal;
a gates, the gates of the shifting transistors being connected respectively to the corresponding output end of the switch and the gate of the regulating transistor.

10. A method to output a non-linear current comprising acts of:
determining an optimum non-linear output current based on a gamma curve of a specific liquid crystal display and obtaining a linear output current produced by an R-2R transistor-only ladder converter;
dividing a linear output current into multiple sections;
determining slopes of the waveform of the output current and the linear output current in each section;

adding a controller corresponding to the R-2R transistor-only ladder converter, wherein the R-2R transistor-only ladder converter comprises at least one regulating transistor and at least one shifting transistor;

setting an aspect ratio $k_R(W/L)$ of a regulating transistor and adjusting the slope of the output current to correspond to the slope ratio of output current in each section; and setting an aspect ratio $k_S(W/L)$ of a shifting transistor and offsetting the output current and forming a non-linear output current waveform to agree with the optimum non-linear output current.

11. A method to output a non-linear current comprising acts of:

determining an optimum non-linear output current curve for gamma correction;

dividing the non-linear curve into multiple segments and designing the slope and offset in each segment to fit the optimum non-linear output;

determining the aspect ratio of regulating transistor for changing the slope in each codes' segment;

determining the aspect ratio of shifting transistor for changing the offset in each codes' segment; and combining the controller with the R-2R transistor-only ladder to output non-linear current, wherein the act of determining the optimum non-linear output current determines the optimum non-linear output current based on a gamma curve of a specific Liquid Crystal Display (LCD) and obtains a linear output current produced by the R-2R transistors-only ladder converter.

* * * * *